United States Patent [19]
Koshikawa

[11] Patent Number: 6,014,341
[45] Date of Patent: Jan. 11, 2000

[54] SYNCHRONOUS-TYPE SEMICONDUCTOR STORAGE

[75] Inventor: Yasuji Koshikawa, Tokyo, Japan

[73] Assignee: NEC Corporation, Tokyo, Japan

[21] Appl. No.: 09/131,198

[22] Filed: Aug. 7, 1998

[30] Foreign Application Priority Data

Aug. 8, 1997 [JP] Japan ................... 9-227393

[51] Int. Cl.⁷ .................................................. G11C 8/00
[52] U.S. Cl. .......................................... 365/233; 365/194
[58] Field of Search .............................. 365/233, 230.08, 365/194

[56] References Cited

U.S. PATENT DOCUMENTS

| 5,313,422 | 5/1994 | Houston | 365/194 |
|---|---|---|---|
| 5,341,341 | 8/1994 | Fukuzo | 365/233 |
| 5,566,130 | 10/1996 | Durham et al. | 365/233 |
| 5,740,123 | 4/1998 | Uchida | 365/233 |

FOREIGN PATENT DOCUMENTS

| 61-148692 | 7/1986 | Japan . |
|---|---|---|
| 6-76566 | 3/1994 | Japan . |
| 7-45068 | 2/1995 | Japan . |

Primary Examiner—David C. Nelms
Assistant Examiner—VanThu Nguyen
Attorney, Agent, or Firm—Foley & Lardner

[57] ABSTRACT

A synchronous-type semiconductor storage which includes a first pulse generating circuit that generates a first pulse in response to the level shifting of an external clock input from a first level to a second level; and a second pulse generating circuit that generates a second pulse in response to the level shifting of a second signal input other than the external clock input; wherein an internal synchronous signal is generated in response to both the first pulse and the second pulse.

4 Claims, 11 Drawing Sheets

SYNCHRONOUS-TYPE SEMICONDUCTOR STORAGE

FIELD OF THE INVENTION

This invention relates to a synchronous-type semiconductor storage, and more particularly to, an internal synchronous signal generating circuit of synchronous-type semiconductor storage.

BACKGROUND OF THE INVENTION

Recently, an increase in operation speed of semiconductor storage has been desired with that of CPU. For example, synchronous-type semiconductor storages that operate synchronizing with an external clock exceeding 100 MHz have been proposed in Japanese patent application laid-open Nos. 61-148692 (1986), 6-76566 (1994) and 7-45068 (1995) etc.

A typical conventional semiconductor storage is, as shown in FIG. 1, composed of an input receiver 1 that an external clock CLK is input, an input receiver 2 that a /CS signal (chip selection signal) is input, an input receiver 3 that a /RAS signal (row address strobe signal) is input, an input receiver 4 that a /CAS signal (column address strobe signal) is input, an input receiver that a /WE signal (write enable signal) is input, an input receiver 6 that an address signal ADD is input, an input receiver 7 that a data input signal is input, a pulse generating circuit 8 that the output of the input receiver 1 is input, an inverter I15 that the output of the pulse generating circuit 8 is input and outputs an internal synchronous signal ICLK, a command decoder 10 that the outputs of the input receivers 2, 3, 4, 5 and 6 and the internal synchronous signal ICLK are input and outputs several decoded control signals 12, and an internal circuit 11 that the control signal 12 and the outputs of the input receivers 6 and 7 are input and outputs data to a data output terminal.

Also, the pulse generating circuit 8 is, for example, composed of an inverter I1 that receives an input to the pulse generating circuit 8, an inverter I2 that the output of the inverter I1 is input, an inverter I3 that the output of the inverter I2 is input, and a NAND gate NA1 that the input to the pulse generating circuit 8 and the output of the inverter I3 are input.

FIG. 2 is an illustration of operation waveforms showing the relation between the external clock CLK and the internal synchronous signal ICLK. When the external clock CLK shifts from Low level to High level and then the output of the input receiver 1 shifts to High level as well, the output of the NAND gate NA1 becomes Low because the output of the inverter I3 was High at that time. Thereby, the internal synchronous signal ICLK, i.e., the output of the inverter I15, becomes High. With the shifting of the output of the input receiver 1 to High level, the output of the inverter I3 becomes Low after a certain time. Thereby, the output of the NAND gate NA1 becomes High and the output of the inverter I15, the internal synchronous signal ICLK, becomes Low.

Thus, the internal synchronous signal ICLK is produced by the shifting of the external clock CLK from Low level to High level.

Synchronizing with the internal synchronous signal ICLK, the levels of the external signals /CS, /RAS, /CAS and /WE are taken into the command decoder 10. Then, the control signals 12 are produced by latching and decoding them.

An example of a use of the conventional synchronous-type semiconductor storage will be explained in FIG. 3. As shown, at a timing C1 when the external clock CLK shifts from Low level to High level, an active command is input with setting /CS, /RAS, /CAS and /WE to be Low, Low, High and High levels, respectively. Simultaneously, a row address (ROW) is given as an address signal ADD. After a certain time, at a timing C2 when the external clock CLK shifts from Low level to High level, a read command is input with setting /CS, /RAS, /CAS and /WE to be Low, High, Low and High levels, respectively. Simultaneously, a column address (COL) is given as an address signal ADD. Then, data according to the row address and column address input are output to the data output terminal. Further, after a certain time, at a timing C3 when the external clock CLK shifts from Low level to High level, a precharge command is input with setting /CS, /RAS, /CAS and /WE to be Low, Low, High and Low levels, respectively. Thereby, the internal circuit is set in a stand-by state to allow the next access.

On the other hand, an example of a use of an asynchronous-type dynamic RAM, which similarly relates to reading out of data, will be explained in FIG. 4. As shown, at a timing C1, shifting /RAS from High to Low, an active command is input and a row address (ROW) is simultaneously given as an address signal. After a certain time, at a timing C2, while keeping /WE High level and shifting /CAS from High to Low, a read command is input and a column address (COL) is simultaneously given as an address signal. Then, data according to the row address and column address input are output to the data output terminal. Further, after a certain time, at a timing C3, a precharge command is input by returning /RAS and /CAS to High level. Thereby, the internal circuit is set in a stand-by state to allow the next access.

In comparing the example of the synchronous-type semiconductor storage in FIG. 3 with the example of the asynchronous-type semiconductor storage in FIG. 4, a time (t1) from the timing C1 until outputting data DOUT to the data output terminal is about equal to each other. Also, a time (t2) from the timing C1 until inputting the precharge command and further a time (t3) from the timing C1 until again inputting the active command after conducting the precharge are equal to each other. However, as to the operating frequency of external signal, the asynchronous-type semiconductor storage in FIG. 4 has only an external signal to be operated at a frequency of (1/2t3)Hz at the maximum whereas the synchronous-type semiconductor storage in FIG. 3 has an external clock CLK to be operated at a frequency of (3/t3)Hz at the maximum.

In the conventional synchronous-type semiconductor storage, to output one-bit data needs 3 cycles of operations of the external clock CLK. Therefore, to reduce t3 to conduct a memory cell test in a short time, a memory tester to operate at a high frequency is necessary.

For example, to conduct the test at t3=100 ns, the external clock has to be operated at 33 MHz. Particularly in a test process to contact a wafer with a probe, a test environment to operate at 33 MHz must be arranged taking the impedance, load etc. of the probe into account. In such a case, a further investment will be required, compared with the test environment of the asynchronous-type semiconductor storage.

Also, in a burn-in test that is generally conducted in a test after fabrication, a number of semiconductor storages are tested in parallel. Therefore, the tester can only drive a low-frequency signal because it has to drive a high load. Because of this, in testing the conventional synchronous-type semiconductor storage by the tester, an access time to one-bit memory cell becomes longer than that in the asynchronous-type semiconductor storage. Thus, the test time must be significantly prolonged.

SUMMARY OF THE INVENTION

Accordingly, it is an object of the invention to provide a synchronous-type semiconductor storage that the memory test can be performed at a frequency much higher than that of a memory tester even when using the memory tester with only a low-frequency external clock, thereby reducing the test time.

According to the invention, a synchronous-type semiconductor storage, comprises:

a first pulse generating circuit that generates a first pulse in response to the level shifting of an external clock input from a first level to a second level; and a second pulse generating circuit that generates a second pulse in response to the level shifting of a second signal input other than the external clock input;

wherein an internal synchronous signal is generated in response to both the first pulse and the second pulse.

According to another aspect of the invention, a synchronous-type semiconductor storage, comprises:

a pulse generating circuit that allows a pulse to generate in response to the level shifting of an external clock input from a first level to a second level and allows the pulse to generate also in response to the level shifting of a second signal input other than the external clock input;

wherein an internal synchronous signal is generated in response to the pulse.

According to another aspect of the invention, a synchronous-type semiconductor storage, comprises:

a first pulse generating circuit that generates a first pulse in response to the level shifting of an external clock input from a first level to a second level; and a second pulse generating circuit that generates a second pulse in response to the level shifting of a pad that is not subject to a bonding in fabrication;

wherein an internal synchronous signal is generated in response to both the first pulse and the second pulse.

According to another aspect of the invention, a synchronous-type semiconductor storage, comprises:

a first pulse generating circuit that generates a first pulse in response to the level shifting of an external clock input from a first level to a second level;

first and second input buffers that receives a second signal input other than the external clock input; and a second pulse generating circuit that generates a second pulse in response to the level shifting of an output of the first input buffer;

wherein an internal synchronous signal is allowed to respond to both the first pulse and the second pulse, the second input buffer is controlled not to activate when the internal synchronous signal is set to respond to the second pulse, and the first input buffer is controlled not to activate when the internal synchronous signal is set not to respond to the second pulse.

BRIEF DESCRIPTION OF THE DRAWINGS

The invention will be explained in more detail in conjunction with the appended drawings, wherein.

DESCRIPTION OF THE PREFERRED EMBODIMENTS

A synchronous-type semiconductor storage in the preferred embodiments will be explained below. The synchronous-type semiconductor storage in the preferred embodiments comprises a first pulse generating circuit ("8" in FIG. 5) that generates a first pulse in response to the change of an external clock input from a first level to a second level, and a second pulse generating circuit ("9" in FIG. 5) that generates a second pulse in response to the level change of a second signal input other than the external clock input. Thereby, in testing, an internal synchronous signal that changes in response to the level change of the external clock input or second signal from the first level to the second level, i.e., in response to both the first and second pulses, can be generated.

A synchronous-type semiconductor storage in the first preferred embodiment will be explained in FIG. 5.

Figure 5:
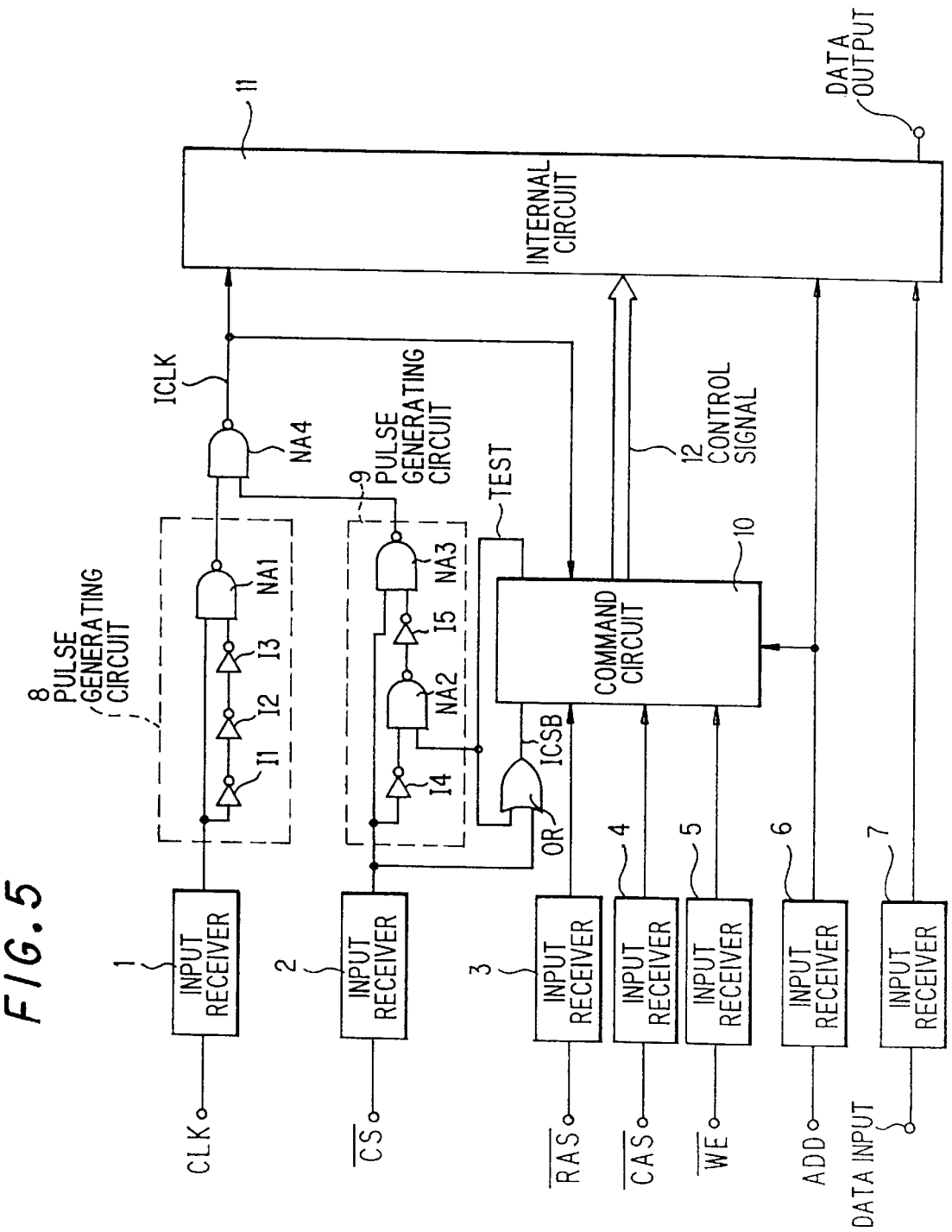
FIG. 5 is a block diagram showing a synchronous-type semiconductor storage in a first preferred embodiment according to the invention.

Referring to FIG. 5, the synchronous-type semiconductor storage in the first embodiment comprises an input receiver 1 that an external clock CLK is input, an input receiver 2 that a /CS signal is input, an input receiver 3 that a /RAS signal is input, an input receiver 4 that a /CAS signal is input, an input receiver 5 that a /WE signal is input, an input receiver 6 that an address signal ADD is input, an input receiver that a data input signal is input, the pulse generating circuit 8 that the output of the input receiver 1 is input, the pulse generating circuit 9 that the output of the input receiver 2 is input, a NAND gate NA4 that the outputs of the pulse generating circuits 8, 9 are input and outputs an internal synchronous signal ICLK, a command decoder 10 that the outputs of the input receivers 2, 3, 4, 5 and 6 and the internal synchronous signal ICLK are input and outputs a plurality of control signals 12 to be decoded and a test mode activating signal TEST, a OR circuit OR that the test mode activating signal TEST and the output of the input receiver 2 are input and outputs a signal ICSB, and an internal circuit 11 that the internal synchronous signal ICLK, control signals 12, and the outputs of the input receivers 6, 7 are input and outputs data to a data output terminal.

The pulse generating circuit 8, for example, comprises an inverter I1 that receives an input to the pulse generating circuit 8, an inverter I2 that the output of the inverter I1 is input, an inverter I3 that the output of the inverter I2 is input, and a NAND gate NA1 that an input to the pulse generating circuit 8 and the output of the inverter I3 are input.

The pulse generating circuit 9, for example, comprises an inverter I4 that receives an input to the pulse generating circuit 9, a NAND gate NA2 that the output of the inverter I4 and the test mode activating signal TEST are input, an inverter I5 that the output of the NAND gate NA2 is input, and a NAND gate NA3 that an input to the pulse generating circuit 9 and the output of the inverter I5 are input.

Figure 6:
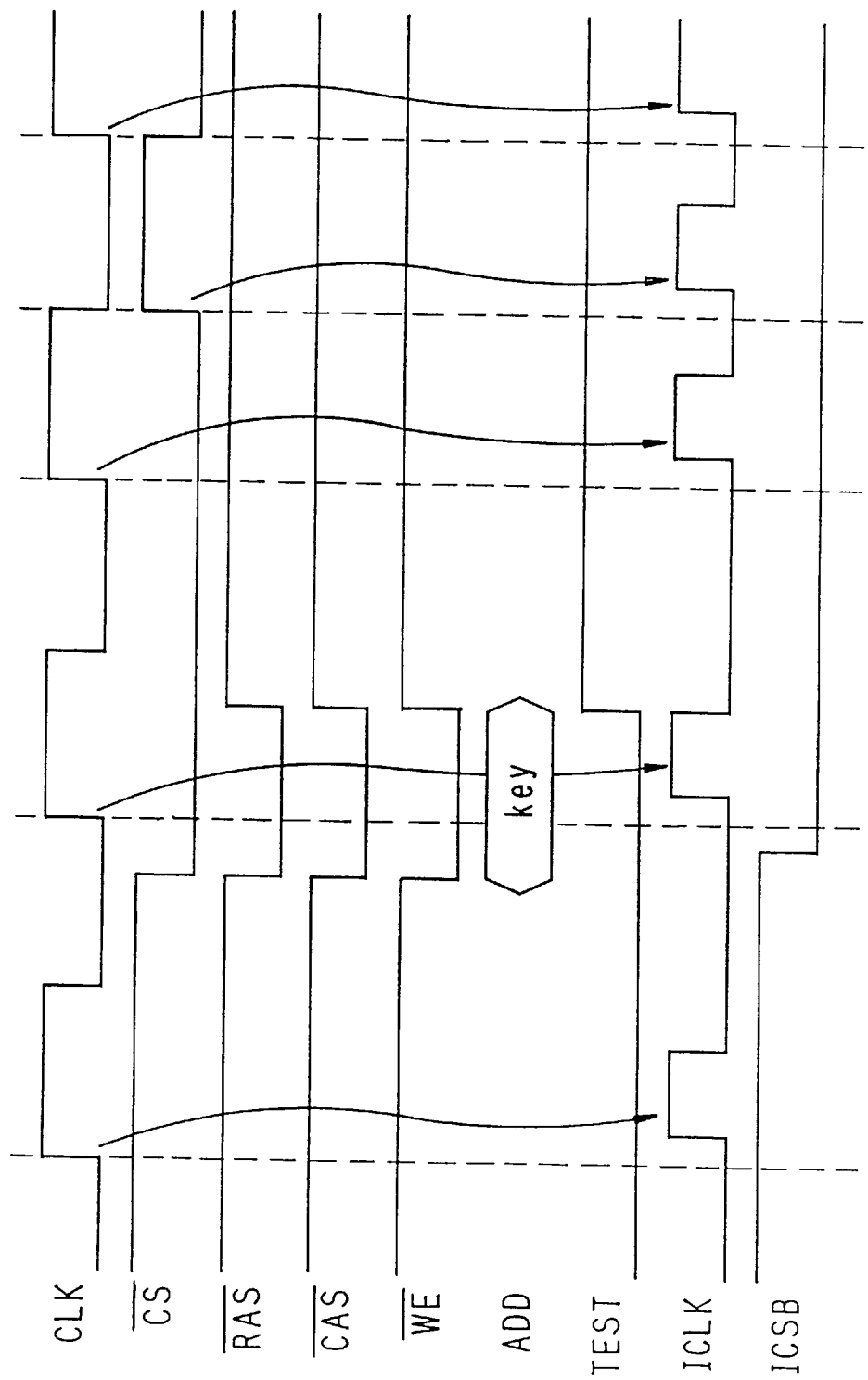
FIG. 6 is an operation-waveform diagram showing the operation of the synchronous-type semiconductor storage in the first embodiment.

FIG. 6 is an illustration of operation waveforms in the operation of the synchronous-type semiconductor storage in the first embodiment. Referring to FIGS. 5 and 6, the operation of the synchronous-type semiconductor storage in the first embodiment will be explained below.

When the external clock CLK shifts from Low level to High level and then the output of the input receiver 1 shifts to High level as well, the output of the NAND gate NA1 becomes Low because the output of the inverter I3 was High at that time. On the other hand, when the test mode activating signal TEST is Low level, the output of the NAND gate NA3 is High. Therefore, in response to the output of the NAND gate NA1 shifted to Low, the internal synchronous signal ICLK, the output of the NAND gate NA4, becomes High.

With the shifting of the output of the input receiver 1, where the external clock CLK is input, to High level, the output of the inverter I3 becomes Low after a certain time. Thereby, the output of the NAND gate NA1 becomes High and the internal synchronous signal ICLK, the output of the NAND gate NA4, becomes Low.

Thus, when the test mode activating signal TEST is Low level, i.e., test mode is not activated, the internal synchronous signal ICLK is generated by the shifting of the external clock CLK from Low level to High level, like the conventional technique.

Next, when an external clock CLK shifts from Low level to High level, all of /CS, /RAS, /CAS and /WE are set to be Low level and a key address for test mode entry is simultaneously given to the address signal ADD. Thereby, the test mode activating signal TEST, the output of the command decoder 10, becomes High.

With the shifting of the test mode activating signal TEST to High level, when the /CS signal shifts from Low level to High level and the output of the input receiver 2 shifts to High level as well, the output of the NAND gate NA3 becomes Low because the output of the inverter I5 was High. Thereby, when the output of the NAND gate NA1 is High, the internal synchronous signal ICLK, the output of the NAND gate NA4, becomes High. With the shifting of the output of the input receiver 2 to High level, the output of the inverter I5 becomes Low after a certain time. Thereby, the output of the NAND gate NA3 becomes High and the internal synchronous signal ICLK, the output of the NAND gate NA4, becomes Low.

Namely, the internal synchronous signal ICLK generates by the shifting of either of the external clock CLK and the /CS signal from Low level to High level.

Meanwhile, with the shifting of the test mode activating signal TEST to High level, the signal ICSB as an internal /CS signal is fixed to be Low level (the OR gate OR that the test mode activating signal TEST and the output of the input receiver 2 are input and outputs a signal ICSB in FIG. 5 realizes a logic shown in FIG. 6). /CS is an input signal for selecting a synchronous-type semiconductor storage to access when using several synchronous-type semiconductor storages. Therefore, it is not necessary when testing only one synchronous-type semiconductor storage. Thus, it is no problem that a /CS logic input to the command decoder 10 is fixed to be Low level after test mode entry.

Figure 7:
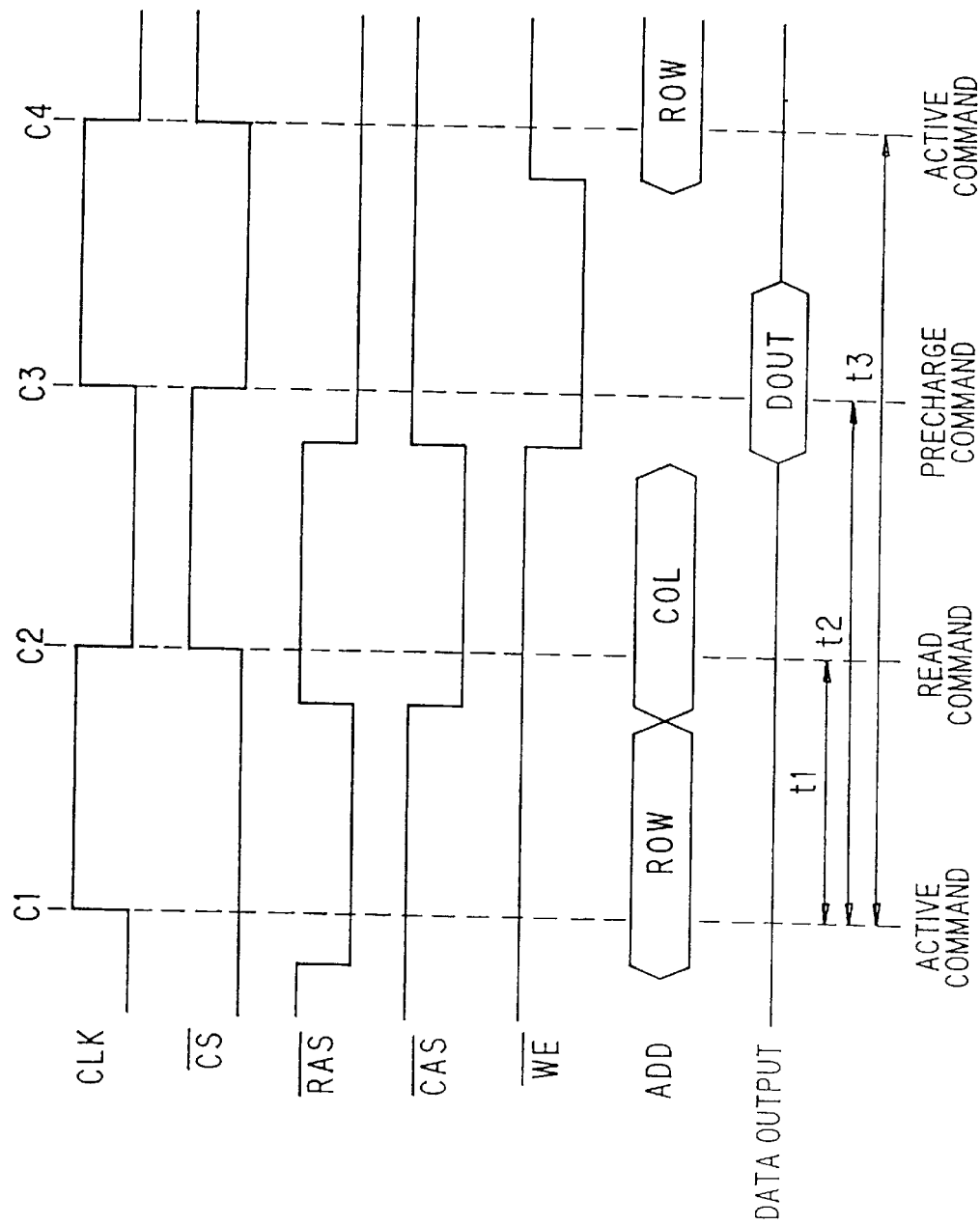
FIG. 7 is an operation-waveform diagram showing an example of a use of the synchronous-type semiconductor storage in the first embodiment.

An example of a use of the synchronous-type semiconductor storage in the first embodiment will be explained in FIG. 7. Referring to FIG. 7, after conducting the test mode entry, at a timing C1 when the external clock CLK shifts from Low level to High level, an active command is input with setting /RAS, /CAS and /WE to be Low, High and High levels, respectively. Simultaneously, a row address (ROW) is given as an address signal ADD. After a certain time, at a timing C2 when the /CS signal shifts from Low level to High level, a read command is input with setting /RAS, /CAS and /WE to be High, Low and High levels, respectively. Simultaneously, a column address (COL) is given as an address signal ADD. Then, data according to the row address and column address input are output to the data output terminal. Further, after a certain time, at a timing C3 when the external clock CLK shifts from Low level to High level, a precharge command is input with setting /RAS, /CAS and /WE to be Low, High and Low levels, respectively. Thereby, the internal circuit is set in a stand-by state to allow the next access.

Figure 1:
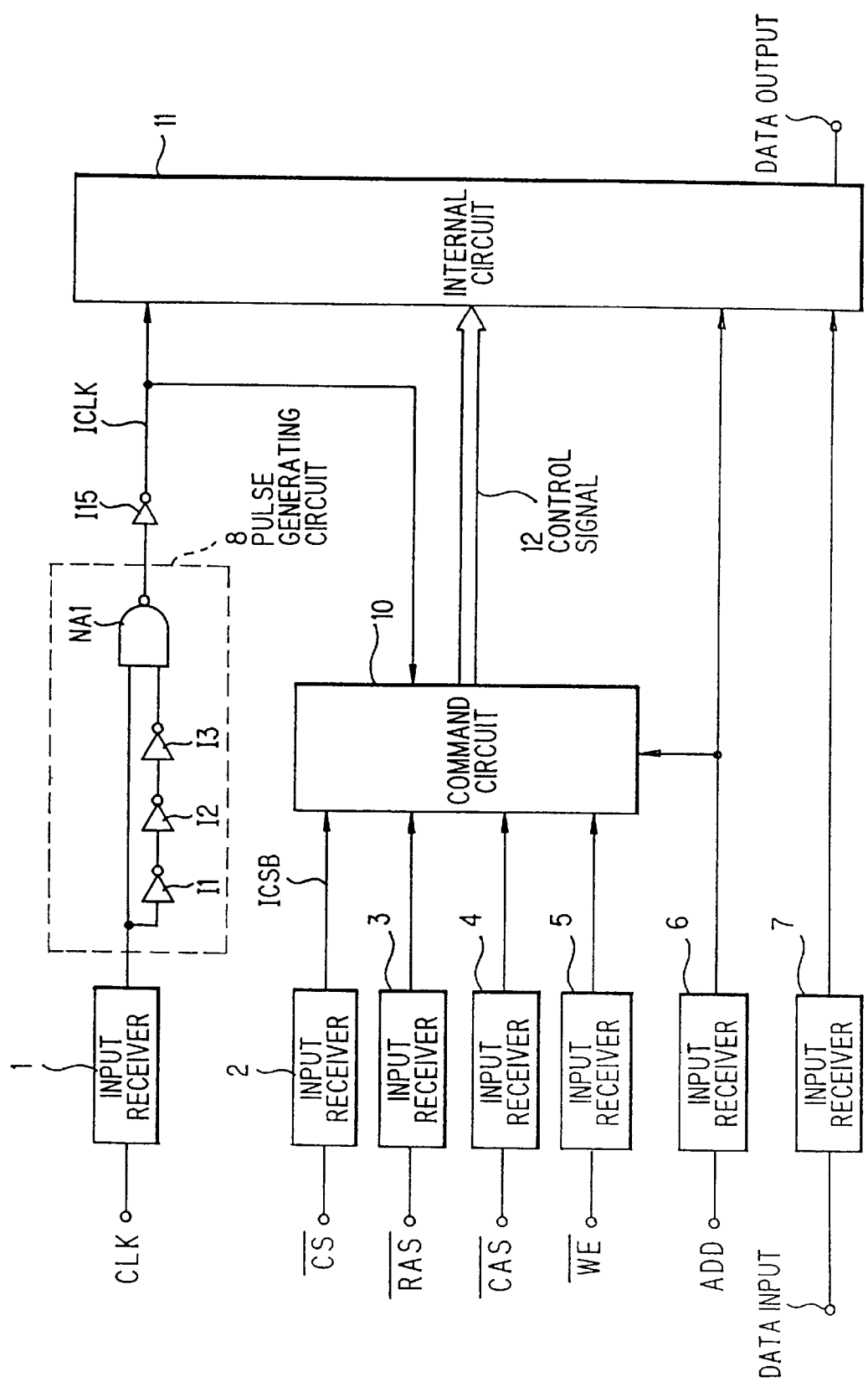
FIG. 1 is a block diagram showing a conventional synchronous-type semiconductor storage.
Figure 2:
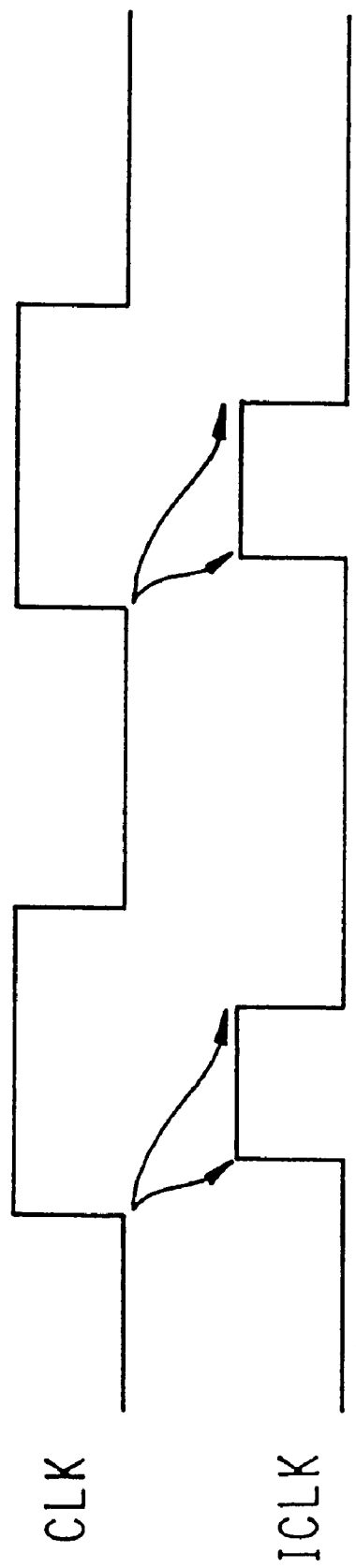
FIG. 2 is an operation-waveform diagram showing the relation between an external clock CLK and an internal synchronous signal ICLK.
Figure 3:
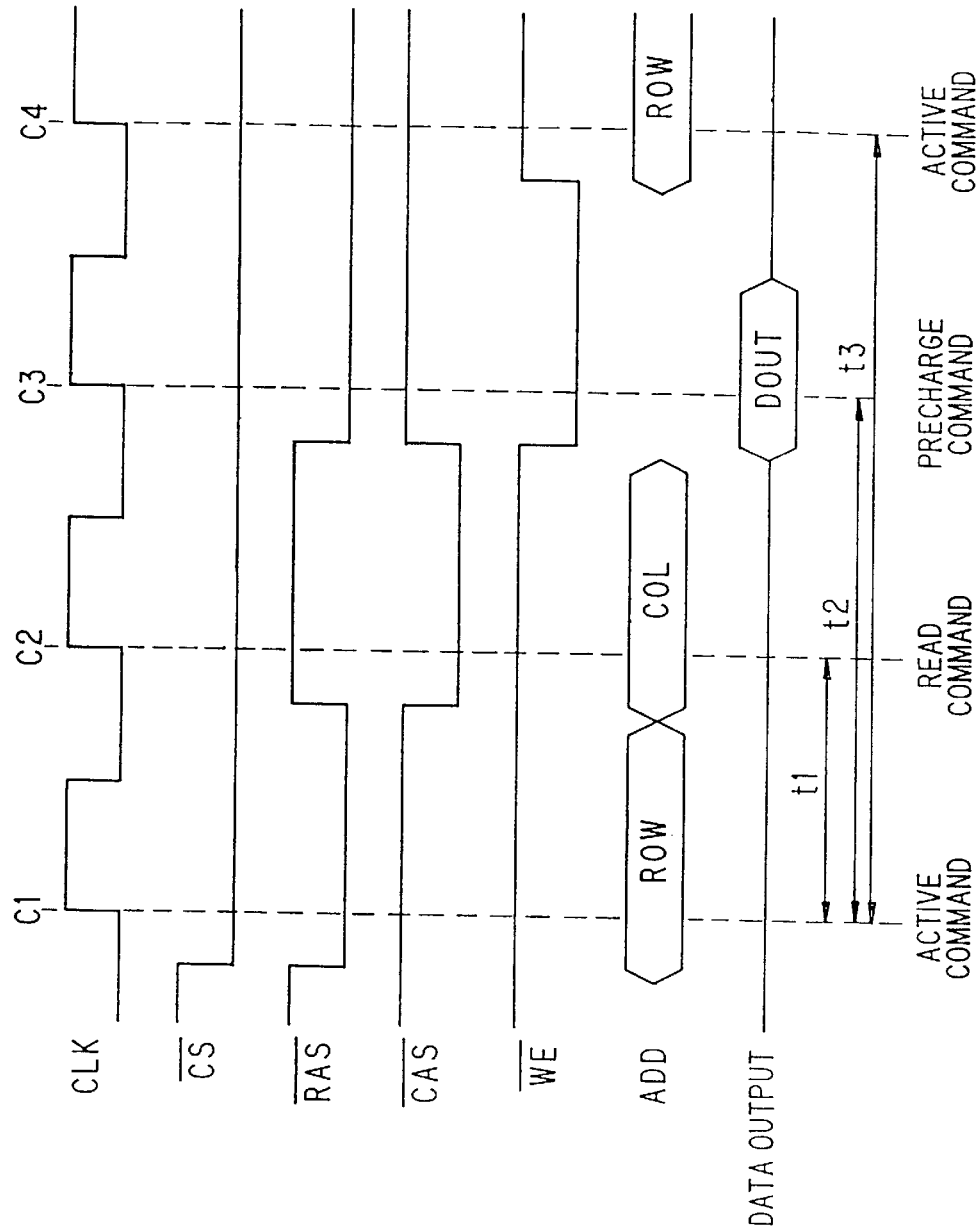
FIG. 3 is an operation-waveform diagram showing an example of a use of the conventional synchronous-type semiconductor storage in FIG. 1.
Figure 4:
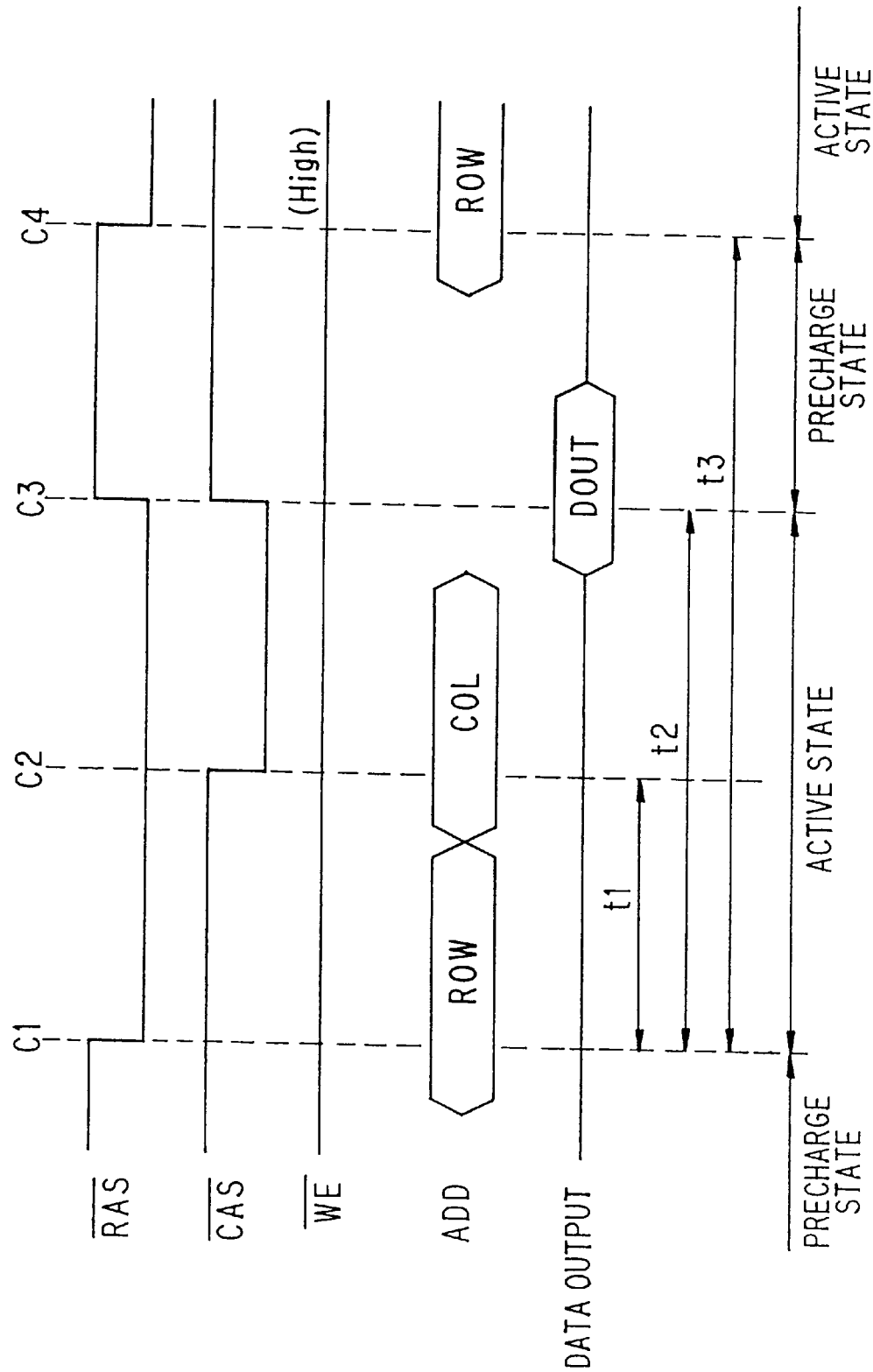
FIG. 4 is an operation-waveform diagram showing an example of a use of a conventional asynchronous-type semiconductor storage.

In comparing with the example of the conventional synchronous-type semiconductor storage in FIG. 3, provided that a time (t1) from the timing C1 until outputting data DOUT to the data output terminal, a time (t2) from the timing C1 until inputting the precharge command and further a time (t3) from the timing C1 until again inputting the active command after conducting the precharge are equal to each other, as to the operating frequency of external signal, the synchronous-type semiconductor storage in the first embodiment has only an external signal to be operated at a frequency of (3/2t3)Hz at the maximum whereas the conventional synchronous-type semiconductor storage in FIG. 3 has an external clock CLK to be operated at a frequency of (3/t3)Hz at the maximum. As a result, the frequency is reduced to ½.

A synchronous-type semiconductor storage in the second preferred embodiment will be explained in FIG. 8.

Figure 8:
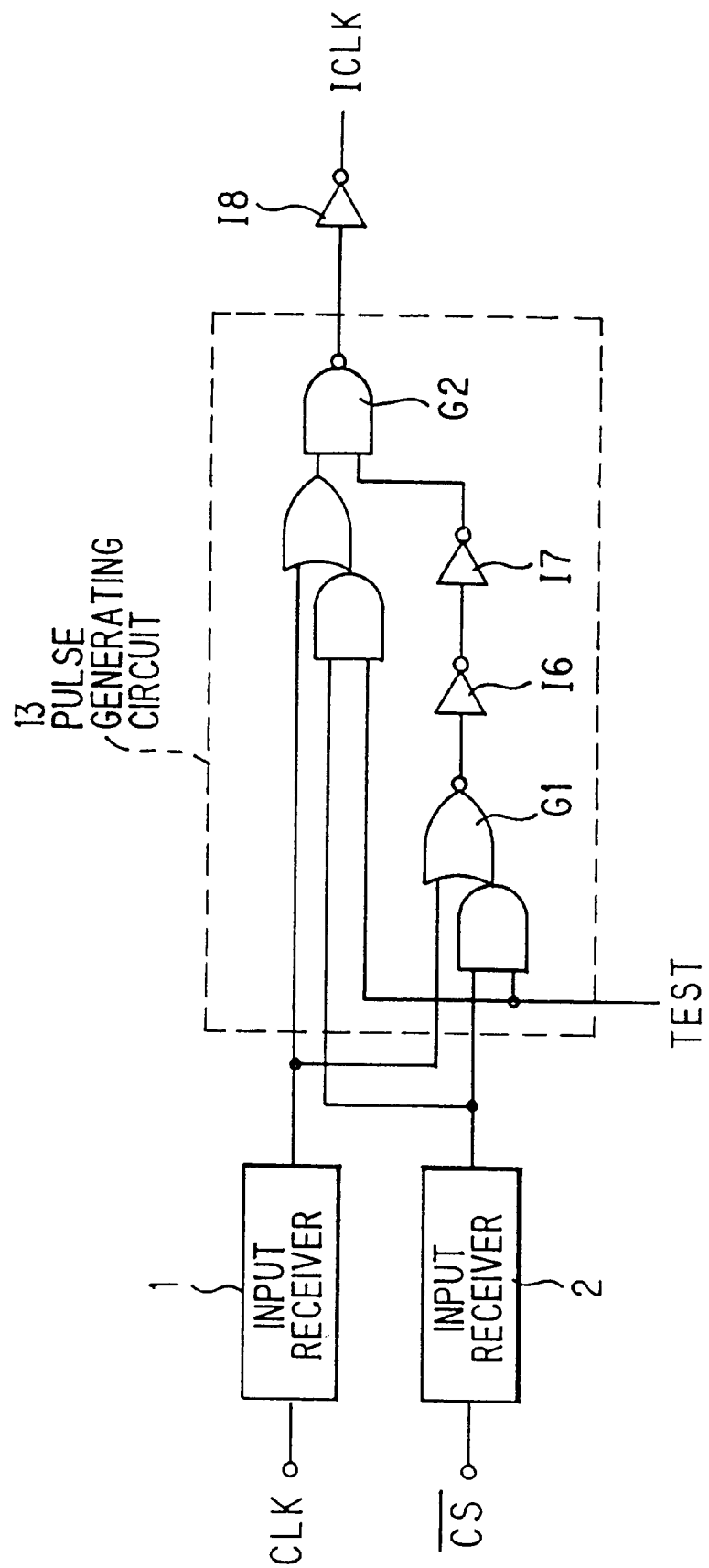
FIG. 8 is a block diagram showing a synchronous-type semiconductor storage in a second preferred embodiment according to the invention.

Referring to FIG. 8, the synchronous-type semiconductor storage in the second embodiment comprises an input receiver 1 that an external clock CLK is input, an input receiver 2 that a /CS signal is input, a pulse generating circuit 13 that the outputs of the input receivers 1, 2 and a test mode activating signal TEST are input, and an inverter I8 that the output of the pulse generating circuit 13 is input and outputs an internal synchronous signal ICLK.

Also, the pulse generating circuit 13 comprises a NOR gate G1 that takes a NOR logic between an AND logic between the output of the input receiver 2 and the test mode activating signal TEST and the output of the input receiver 1, an inverter I6 that the output of the NOR gate G1, an inverter I7 that the output of the inverter I6 is input, and a NAND gate G2 that takes a NAND logic between an OR logic and the output of the inverter I7, where the OR logic is taken between an AND logic between the output of the input receiver 2 and the test mode activating signal TEST and the output of the input receiver 1.

The operation of the synchronous-type semiconductor storage in the second embodiment is the same as that in the first embodiment. However, the outputs of the input receivers 1, 2 are taken of their logic's on the earlier stage. Therefore, the inverter can be used as an output buffer for internal synchronous signal ICLK with a large load. In general, a buffer using a large-capacity transistor is required to drive a signal with a large load. Thus, using the inverter with only two transistors as the buffer can provide a reduced circuit area, compared with using the NAND gate with four transistors as the buffer.

A synchronous-type semiconductor storage in the third preferred embodiment will be explained in FIG. 9.

Figure 9:
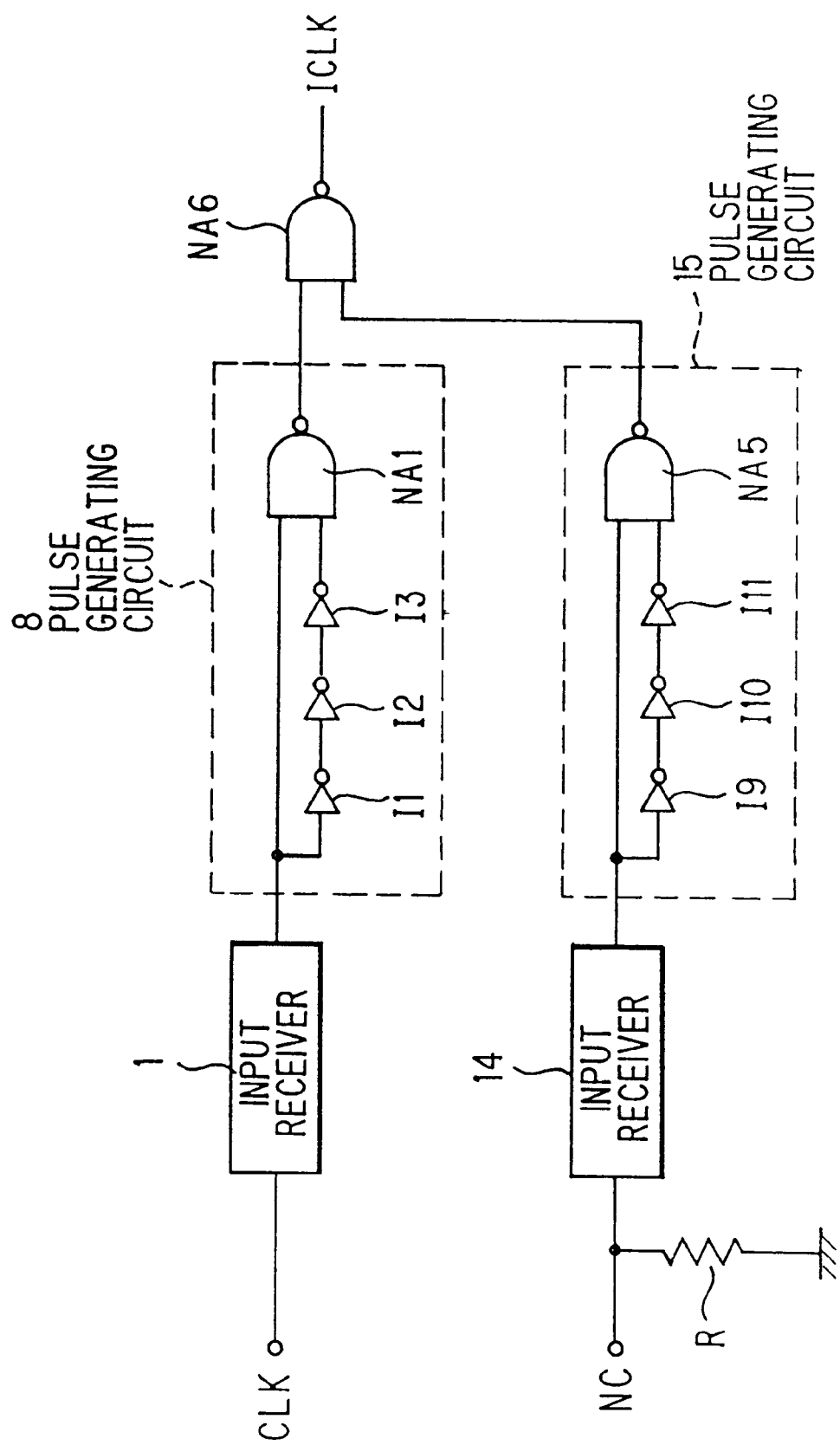
FIG. 9 is a block diagram showing a synchronous-type semiconductor storage in a third preferred embodiment according to the invention.

Referring to FIG. 9, the synchronous-type semiconductor storage in the third embodiment comprises an input receiver 1 that an external clock CLK is input, an input receiver 14 that is connected with a no-connect pad NC, a pulse generating circuit 8 that the output of the input receiver 1 is input, a pulse generating circuit 15 that the output of the input receiver 14 is input, a NAND gate NA6 that the outputs of the pulse generating circuits 8, 9 are input and outputs an internal synchronous signal ICLK, and a resistance element R with a sufficiently large value inserted between the input receiver 14 and the ground.

Also, the pulse generating circuit 8, for example, comprises an inverter I1 that receives an input to the pulse generating circuit 8, an inverter I2 that the output of the inverter I1 is input, an inverter I3 that the output of the inverter I2 is input, and a NAND gate NA1 that an input to the pulse generating circuit 8 and the output of the inverter I3 are input.

The pulse generating circuit 9, for example, comprises an inverter I9 that receives an input to the pulse generating circuit 9, an inverter I10 that the output of the inverter I9 is input, an inverter I11 that the output of the inverter I10 is input, and a NAND gate NA5 that an input to the pulse generating circuit 9 and the output of the inverter I11 are input.

In the wafer test, a probe is also stood against the no-connect pad NC that is not subject to the bonding in fabrication. Thereby, an internal synchronous signal ICLK can be generated with the shifting of either input of the external clock CLK or the no-connect pad NC from Low level to High level.

In the first and second embodiments, the level shift of /CS signal is used. In contrast with this, in the third embodiment, the no-connect pad that is not subject to the bonding in fabrication is used. Therefore, a high-frequency test can be conducted while providing a /CS signal with an original function.

Meanwhile, with the resistance element R with a sufficient large value inserted between the input receiver 14 and the ground, the input of the input receiver 14 becomes a ground level when an external potential is not given to the no-connect pad. The resistance element R can be provided using a layer with a large resistance value per unit area, a transistor with a very low performance etc.

A synchronous-type semiconductor storage in the fourth preferred embodiment will be explained in FIG. 10.

Figure 10:
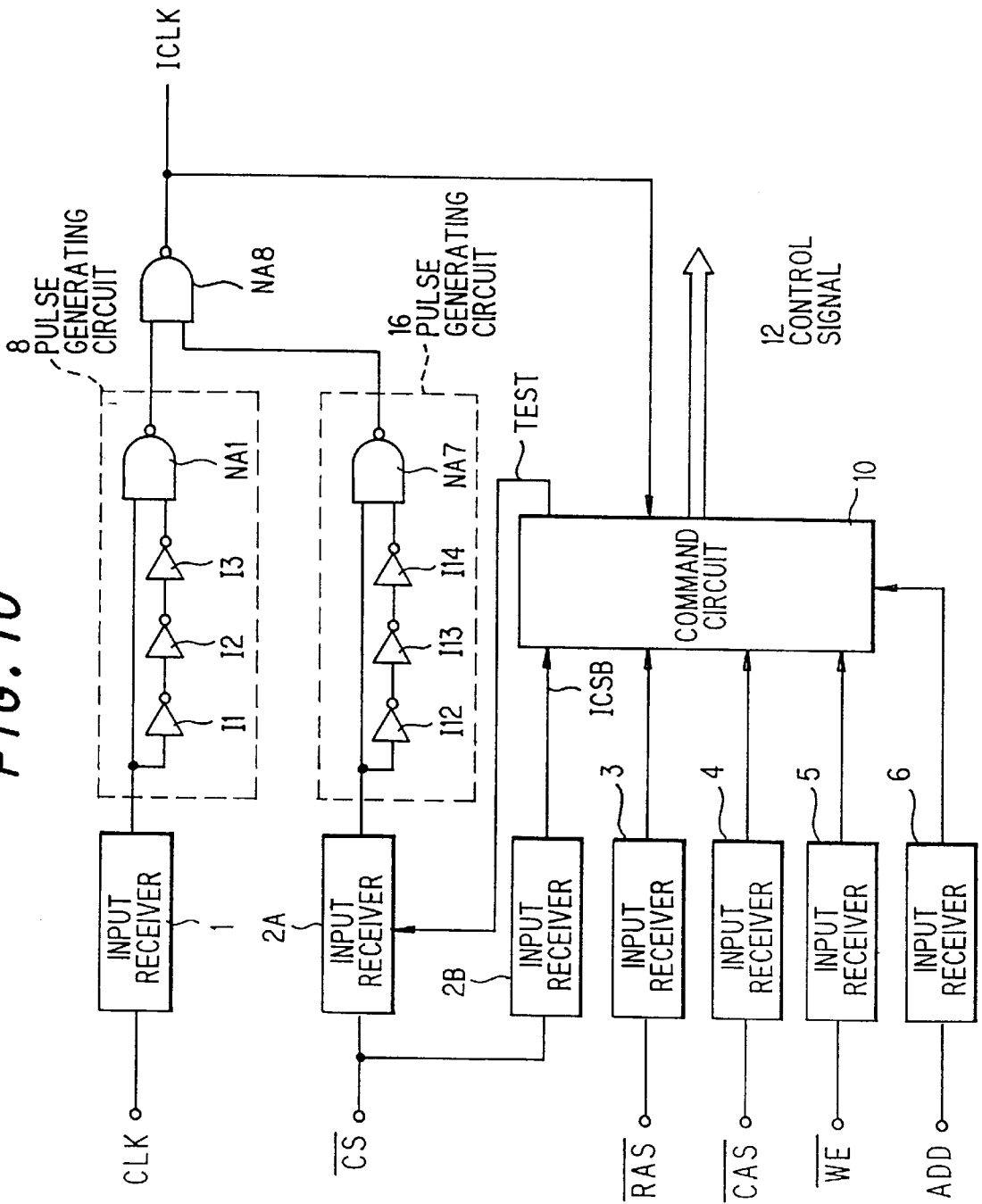
FIG. 10 is a block diagram showing a synchronous-type semiconductor storage in a fourth preferred embodiment according to the invention.

Referring to FIG. 10, the synchronous-type semiconductor storage in the fourth embodiment comprises an input receiver 1 that an external clock CLK is input, an input receiver 2A that a /CS signal and a test mode activating signal TEST are input, an input receiver 2B that a /CS signal is input, an input receiver 3 that a /RAS signal is input, an input receiver 4 that a /CAS signal is input, an input receiver 5 that a /WE signal is input, an input receiver 6 that an address signal ADD is input, a pulse generating circuit 8 that the output of the input receiver 1 is input, a pulse generating circuit 16 that the output of the input receiver 2A is input, a NAND gate NA8 that the outputs of the pulse generating circuits 8, 16 are input and outputs an internal synchronous signal ICLK, and a command decoder 10 that the outputs of the input receivers 2B, 3, 4, 5 and 6 and the internal synchronous signal ICLK are input and outputs a plurality of control signals 12 to be decoded and a test mode activating signal TEST.

The pulse generating circuit 8, for example, comprises an inverter I1 that receives an input to the pulse generating circuit 8, an inverter I2 that the output of the inverter I1 is input, an inverter I3 that the output of the inverter I2 is input, and a NAND gate NA1 that an input to the pulse generating circuit 8 and the output of the inverter I3 are input.

The pulse generating circuit 16, for example, comprises an inverter I12 that receives an input to the pulse generating circuit 16, an inverter I13 that the output of the inverter I12 is input, an inverter I14 that the output of the inverter I13 is input, and a NAND gate NA7 that an input to the pulse generating circuit 16 and the output of the inverter I14 are input.

When the test mode is activated, the test mode activating signal TEST becomes High level and the input receiver 2A is then activated, Thereby, an input according to a /CS signal is given to the pulse generating circuit 16.

On the other hand, when the test mode is not activated, the test mode activating signal TEST is Low level and the input receiver 2A is also not activated. Therefore, a current path in the input receiver is cut down and its output is fixed to be Low level.

In general, an access time from the shifting of external clock CLK from Low level to High level until the outputting of data is an important parameter for synchronous-type semiconductor storage. Namely, an internal synchronous signal ICLK needs to be rapidly generated. Therefore, the response of an input receiver lying on a path to generate the internal synchronous signal ICLK needs to be rapid. Due to this, the transistor size must be increased, causing an increase in consumed current.

In the first and second embodiments, the consumed current must be increased because the input receiver 2 for /CS signal is required to operate rapidly. In the fourth embodiment, the input receiver 2A to operate in the test mode has an increased consumed current so as to operate rapidly, but, in the normal user's mode, the input receiver 2A is not activated and the input receiver 2B with a reduced consumed current is operated. Therefore, the entire consumed current of the synchronous-type semiconductor storage in the fourth embodiment can be reduced.

Figure 11:
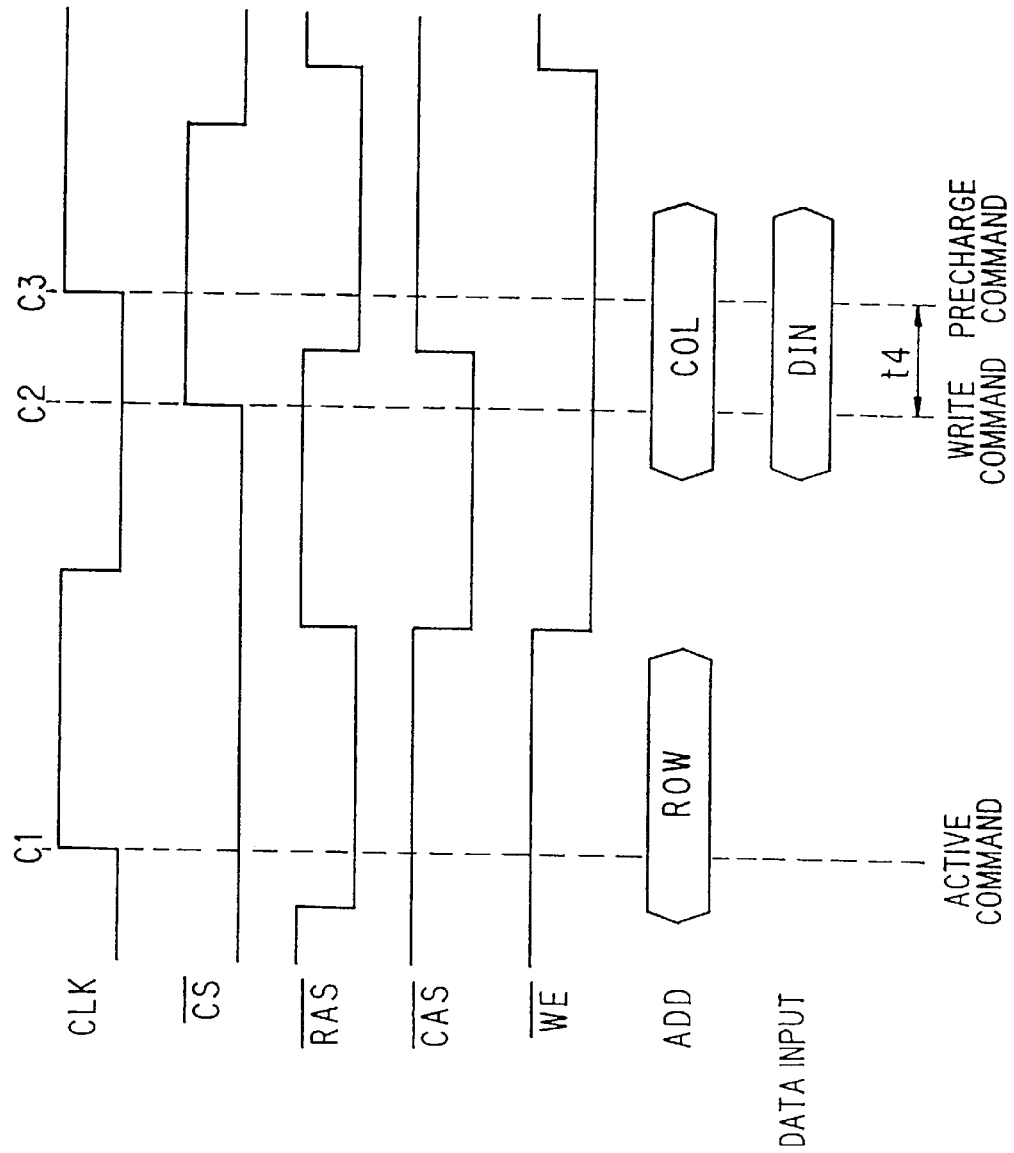
FIG. 11 is an operation-waveform diagram showing another example of a use of the synchronous-type semiconductor storage in the first to fourth embodiments.

Another example of a use of the synchronous-type semiconductor storage of the invention will be explained in FIG. 11. Referring to FIG. 11, after conducting the test mode entry, at a timing C1 when the external clock CLK shifts from Low level to High level, an active command is input with setting /RAS, /CAS and /WE to be Low, High and High levels, respectively. Simultaneously, a row address (ROW) is given as an address signal ADD. After a certain time, at a timing C2 when the /CS signal shifts from Low level to High level, a read command is input with setting /RAS, /CAS and /WE to be High, Low and Low levels, respectively. Simultaneously, a column address (COL) is given as an address signal ADD. Also, by giving a write data DIN to the data input terminal, the write data DIN is written in the row address and column address input. Further, after a certain time, at a timing C3 when the external clock CLK shifts from Low level to High level, a precharge command is input with setting /RAS, /CAS and /WE to be Low, High and Low levels, respectively. Thereby, the internal circuit is set in a stand-by state to allow the next access.

Here, a time t4 from the timing C2 to input the write command until the timing C3 to input the precharge command is generally called "write recovery time", which is an important parameter for synchronous-type semiconductor storage.

The target performance of time t4 could not be tested by a conventional low-frequency memory tester because it is typically equal to the minimum CLK cycle time of synchronous-type semiconductor storage. In this invention, the time t4 can be easily shortened by using the different shift timings of input signals. Therefore, even in a process of using a low-frequency memory tester such as a wafer test process, the measurement of the parameter can be conducted.

Though the invention was explained taking the case of the above embodiments, an internal synchronous signal ICLK can be, in like manner, generated by using the level shifting of an external clock CLK and a DQM signal.

The DQM signal is a function that is regularly provided for some of synchronous-type semiconductor storages and is to temporarily mask (disable) data output or data input. It is a signal that can be allowed to fix its level inside in testing, like the /CS signal.

Furthermore, by generating an internal synchronous signal ICLK from any of /CS, QM inputs as well as an external clock CLK, the memory test can be performed at a frequency three times that of a memory tester.

Although the invention has been described with respect to specific embodiments for complete and clear disclosure, the appended claims are not to be thus limited but are to be construed as embodying all modification and alternative constructions that may be occurred to one skilled in the art which fairly fall within the basic teaching here is set forth.

What is claimed is:

1. A synchronous-type semiconductor storage, comprising:
    a first pulse generating circuit that generates a first pulse in response to a level shifting of an external clock input from a first level to a second level; and
    a second pulse generating circuit that generates a second pulse in response to a level shifting of a no-connect pad that is not connected to receive said external clock but is configured to receive an external potential that may be applied thereto;
    wherein an internal synchronous signal is generated in response to both said first pulse and said second pulse.

2. A synchronous-type semiconductor storage, comprising:
    a first pulse generating circuit that generates a first pulse in response to a level shifting of an external clock input from a first level to a second level;
    first and second input buffers that receive a second signal input other than said external clock input; and
    a second pulse generating circuit that generates a second pulse in response to a level shifting of an output of said first input buffer;
    wherein an internal synchronous signal is allowed to respond to both said first pulse and said second pulse,
    said second input buffer is controlled not to activate when said internal synchronous signal is set to respond to said second pulse, and
    said first input buffer is controlled not to activate when said internal synchronous signal is set not to respond to said second pulse.

3. A synchronous-type semiconductor storage as recited in claim 1, wherein said no-connect pad is connected to a ground potential by way of a resistance element, and
    wherein a voltage at said no-connect pad is at the ground potential when said external potential is not applied to said no-connect pad.

4. A synchronous-type semiconductor storage as recited in claim 1, wherein a first operation conducted in response to the generation of the first pulse is the same as a second operation conducted in response to the generation of the second pulse.

* * * * *